United States Patent [19]
White

[11] Patent Number: 5,365,073
[45] Date of Patent: Nov. 15, 1994

[54] NANOFABRICATED STRUCTURES

[75] Inventor: Julian D. White, Cambridge, United Kingdom

[73] Assignee: Hitachi, Ltd., Tokyo, Japan

[21] Appl. No.: 80,730

[22] Filed: Jun. 24, 1993

[30] Foreign Application Priority Data

Jun. 24, 1992 [GB] United Kingdom ............ 9213423.8

[51] Int. Cl.$^5$ ............................................. H01J 37/305
[52] U.S. Cl. .................... 250/492.3; 250/492.2; 369/126
[58] Field of Search ............... 250/492.1, 492.2, 492.3; 369/126; 73/105

[56] References Cited

U.S. PATENT DOCUMENTS

| | | | |
|---|---|---|---|
| 4,878,213 | 10/1989 | Kazau et al. | 369/126 |
| 4,896,044 | 1/1990 | Li et al. | 250/492.2 |
| 4,916,688 | 4/1990 | Foster et al. | 369/126 |
| 4,987,312 | 1/1991 | Eigler | 250/492.3 |
| 5,043,578 | 8/1991 | Güethner et al. | 250/492.2 |
| 5,049,461 | 9/1991 | Annett et al. | 250/492.1 |
| 5,252,835 | 10/1993 | Lieber et al. | 250/492.1 |
| 5,304,535 | 4/1994 | Harmer et al. | 250/492.2 |

Primary Examiner—Jack I. Berman
Assistant Examiner—James Beyer
Attorney, Agent, or Firm—Kenyon & Kenyon

[57] ABSTRACT

A method of forming a nano-scale device with a probe (2) such as a STM on a substrate (1) includes the step of rendering the relevant part of the substrate conductive while the device (5) is being formed with the probe so that current can flow from the probe to the substrate. Thereafter, to operate the device, the substrate is rendered non-conductive so as to prevent dissipation of current from the device through the substrate. The substrate can be altered in conductivity by cooling to undergo a Mott transition, can be heated from a normally non-conductive condition to become conductive, or subjected to laser radiation to induce charge carriers to render it conductive.

6 Claims, 3 Drawing Sheets

1

NANOFABRICATED STRUCTURES

FIELD OF THE INVENTION

This invention relates to a nanofabricated electroconductive structure and a method of fabrication thereof using a probe such as a scanning tunneling microscope (STM).

BACKGROUND OF THE INVENTION

There have been many recent attempts to write small structures at the nano-scale using a STM by various methods, some of which involve manipulating single atoms on the surface of metal or doped semiconductor surfaces. A general review is given in "Atomic and Molecular Manipulation with the Scanning Tunneling Microscope" J. A. Stroscio and D. M. Eigler Science Volume 254, 29 November 1991, p. 1319–1326. However, the structures so far reported have been non-conductive and serve only as a demonstration of the possibilities of the technique. In our GB application No. 9213054.1 filed on 16th June 1992, in contrast to the aforementioned prior art techniques, it is proposed to form nanofabricated structures which are conductive.

A problem with the STM is that when a nano-scale structure is formed on a substrate of the surface e.g. by manipulation of atoms with the probe tip, it necessary for the substrate to exhibit low resistivity in order to permit tunnel current feedback to be established between the probe tip and the substrate. Thus, if an electroconductive nano-scale structure formed on the substrate, its conductivity characteristics merge into the background of conductive substrate and accordingly, it is difficult to test or make use of the conductivity characteristics of the nano-structure on the substrate, particularly when it is intended to be used at room temperature.

With a view to overcoming this problem, the present invention provides a method of forming a nano-scale electro-conductive structure wherein a probe is used to produce a desired configuration of matter on a substrate, including causing the substrate to change from a relatively low to a relatively high conductivity condition, producing with the probe said desired configuration of matter on the substrate while in said relatively high conductivity condition, and thereafter causing the substrate to assume said relatively low conductivity condition, wherein said substrate assumes said relatively low conductivity condition at room temperature, and is heated to a temperature in excess of room temperature to achieve said relatively high conductivity condition during which said structure is formed with said probe.

Another problem encountered when constructing such nanoscale devices on a substrate is that it is difficult to form a device such that it is coupled to external connections on the substrate.

SUMMARY OF THE INVENTION

With a view to overcoming this problem, the present invention provides an electro-conductive nanofabricated structure, comprising a substrate, a nanofabricated electro-conductive configuration of matter formed on the substrate by means of a probe, the substrate including a region of relatively low conductivity between regions of relatively high conductivity for the operational temperature of the device, the configuration being disposed on said low conductivity region and electrically contacting said regions of high conductivity, said low conductivity region being changeable to a high conductivity condition to thereby permit the assembly of said configuration with said probe, said high and low conductivity regions presenting a substantially continuous surface thus permitting assembly of said matter configuration in electrical connection with said high conductivity regions.

Conveniently, the substrate comprises a doped semiconductor, in which case, the temperature change can be used to induce a Mott transition.

Alternatively, a radiation source such as a laser can be used to produce carriers in the substrate to render it temporarily conductive while the desired configuration of matter is assembled with the probe. The desired configuration of matter can be formed on the substrate with a STM. Conveniently, the method includes producing atomic emission from the probe so as to form a desired deposit of emitted atoms from the probe onto the substrate as a conductive structure. The structure may comprise a plurality of deposited regions of conductive material arranged in a chain. The chain may include predetermined spacings therein for defining capacitances which present Coulomb blockade to single electron tunneling along the chain.

BRIEF DESCRIPTION OF THE DRAWINGS

In order that the invention may be more fully understood an embodiment thereof will now be described by way of example with reference to the accompanying drawings in which.

DESCRIPTION OF PREFERRED EMBODIMENTS

In accordance with the invention, a nano-scale structure is formed on a substrate using a probe such as a STM, and in order for the STM to operate, one substrate needs to exhibit sufficient conductivity to allow a tunnel current to be established between the tip of the probe and the substrate. In accordance with the invention, in order to permit the electrical characteristics of the nano-structure to be investigated, the substrate is configured to be alterable thereafter into a relatively low conductivity condition. In the example described in more detail hereinafter, a doped semiconductor substrate is used. Preferably, a p-type substrate is used.

The substrate can be switched between relatively high and low conductivities in a number of different ways. Hereinafter, examples of device fabrication methods will firstly be described, and then methods of changing the conductivity of the substrate will be discussed.

Figure 1:
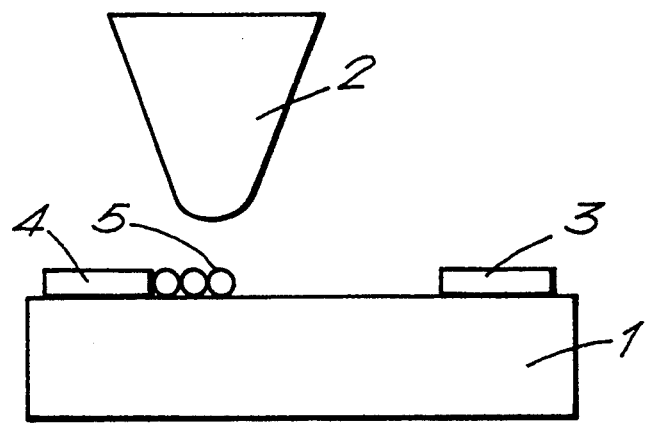
FIG. 1 is a sectional view of a semiconductor substrate onto which gold spheres are formed by emission from the tip of a STM.

Referring now to FIG. 1, this shows schematically how a nano-scale structure is formed on a GaAs substrate 1 using the tip 2 of an STM probe. GaAs is selected as the material for the substrate rather than silicon since silicon suffers from the disadvantage that normally, its surface is covered with a thin layer of insulating oxide which hinders STM investigations. In contrast, GaAs does not form such a stable oxide layer and in addition it is easy to create thin, accurately doped layers on semi-insulating substrates using techniques such as MOCVD or MBE. However, with the advent of suitable deposition techniques, silicon may in future be used.

First and second generally parallel conductive tracks 3, 4 overlie the substrate 1, which may be formed by a lithographic technique e.g. electron beam lithography. The conductive tracks are typically made of a metal that bonds readily to the substrate e.g. Au.

A conductive nano-scale structure is formed on substrate using the STM tip 2. In the method described herein, small spheres of Au are formed in a chain the substrate between the conductive tracks 3, 4 by field emission from the tip of the STM probe 2. As will be explained hereinafter, the substrate is conductive during this process. It was recently reported by Mamin et al (Phys. Rev. Lett. 65, 2418 [1990]) that small spheres of gold can be deposited on a conducting surface using small amplitude/short duration electrical pulses which produce field evaporation of gold from the tip of the STM probe. Globules of gold of the order of 5–10 nm in radius are formed, and after they have been deposited using a voltage pulse, they can be subsequently picked off by positioning the tip directly over the deposit and applying another voltage pulse. The process can be carried out at room temperature and atmospheric pressure. Using an electro-chemically etched gold tip, Mamin et al have recently demonstrated that it is possible to deposit several thousand globules with no appreciable degradation of the imaging peformance of the tip (Mamin, H.J. et al, J. Vac. Sci. Technol B, B9, 1398 [1991]).

In the example of the present invention, the method of Mamin et al is extended, to form an electrically conductive chain of gold or like conductive material between the conductive tracks 3, 4. Thus referring to FIG. 1, a globule of gold 5 is formed by field emission from the tip of a gold wire STM probe 2, by the application of a voltage pulse between the tip of probe 2 and the conductive substrate 1. The process is carried out at room temperature so that the substrate 1 is in its relatively conductive condition, and an appropriate current can flow between the probe 2 and the substrate 1 to facilitate formation of the globules 5.

Figure 2:
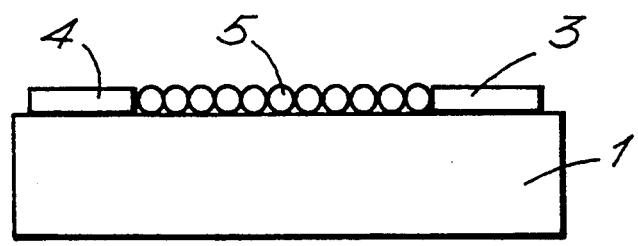
FIG. 2 corresponds to FIG. 1 and shows the completed chain.
Figure 3:
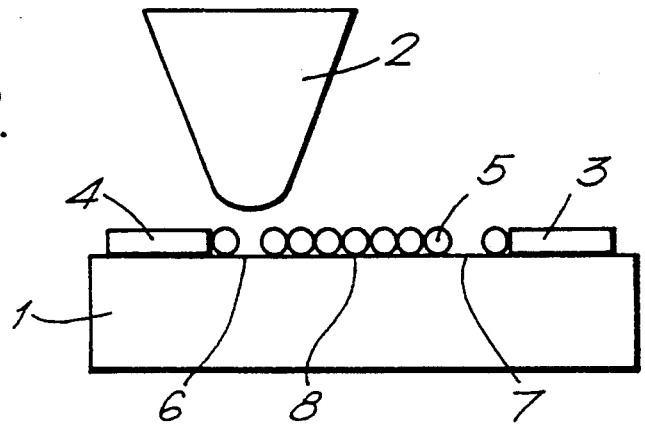
FIG. 3 illustrates removal of certain spheres from the chain.

Referring to FIG. 2, a plurality of the globules 5 is arranged in a chain so as to provide a conductive path between the conductive tracks 3, 4. Referring to FIG. 3, the STM probe 2 is used to remove individual globules 5 at locations 6, 7 by the application of reverse polarity pulses to those used to deposit the globules. As a result, the central portion of the chain defines a node 8 which is coupled capacitively to the tracks 3, 4 since the spaces at locations 6, 7 define capacitors. A device is thus constructed which utilises Coulomb blockade of single electron tunneling to control electron transport between the conductive tracks 3, 4. Devices which use Coulomb blockade to control single electron transport have been described in our co-pending application No. 9206812.1 filed 25th March 1992. Reference is also directed to the prior art acknowledged in that application.

Referring to FIG. 3, the spaces 6, 7 constitute tunneling capacitors, whose capacitance is of the order of $10^{-18} - 10^{-19}$ farads on the assumption that the space between the adjacent globules 5 is a vacuum. Such a capacitance is far smaller than presently achievable with conventional electron beam lithography techniques and allows Coulomb blockade effects in the tunneling of single electrons at temperatures at or in excess of room temperature.

In the configuration shown in FIG. 3, the electron transport in regions 6, 7 can occur either via leakage currents through the nominally insulating substrate, or if deposits are sufficiently close (1 nm) then transport may occur via vacuum tunneling. This contrasts with the prior art aforementioned in which an insulating material is used as a dielectric in the capacitive junctions, typically a metal oxide or some other material. A problem with such a dielectric barrier is that it usually contains intermediate states which can act as traps for electrons and the presence of such traps disturbs the ordered flow of electrons through the barrier. However, in the configuration shown in FIG. 3, there are no such traps within the material of the tunnel barrier and so such effects will be absent.

Such small capacitances and the associated very large charging energies will have significant benefits for the operation of Coulomb blockade devices such as those used to count single electrons (see our GB patent application 9206149.8). In such prior quantum standards, a signal of frequency f is applied to the device to operate it as a turnstile to allow the passage of electrons one by one through the device, in order to provide a current I whose value is given by ef, where e is the electron charge. One of the main problems encountered in such a device is that a small minority of electrons do not pass through the device in an orderly fashion. Either a spurious electron passes through the device, increasing the current, or an electron does not tunnel when it should, which can be thought of as a dropout. Dropouts lead to a decrease in the output current and the effect becomes more noticeable as the applied frequency is increased. The combination of the two effects lead to random variations in the output current which spoil the relation I=ef. For a current standard, these errors should be kept to a factor of $10^{-8}$ or less than the main current. When the charging energy of the device is increased, it is found that the the number of spurious electrons is reduced as the process is governed by an activation law. In the configuration shown in FIG. 3, the very small capacitances associated with the region 6, 7 give rise to a substantially increased charging energy compared with the prior art dielectric type capacitances and accordingly, the aforementioned errors in current standard are reduced substantially.

Similarly, the frequency at which the device can be clocked before dropouts occur, is increased due in part to the fact that the RC time constants of the junctions 6, 7 are decreased compared to the prior art.

Figure 4:
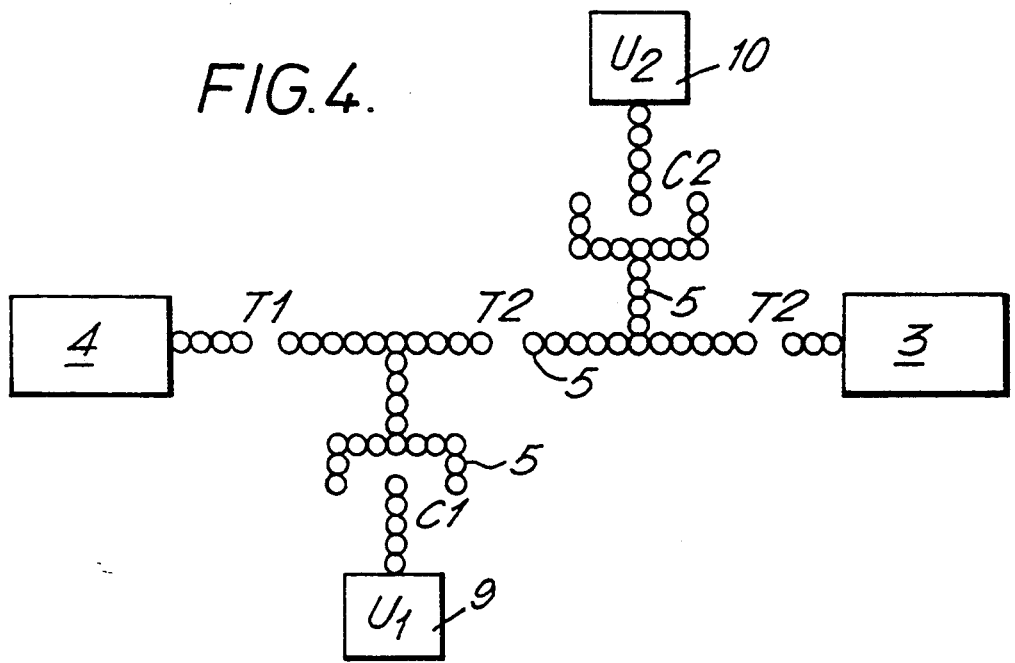
FIG. 4 illustrates in plan view an electron pump operable by Coulomb blockade of single electron tunneling.
Figure 5:
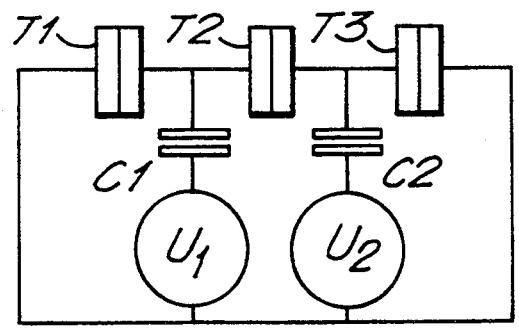
FIG. 5 is a schematic equivalent circuit for the electron pump shown in FIG. 4.

An example of a device used to count single electrons is shown in FIG. 4, and its equivalent circuit is shown in FIG. 5, and is called a single electron pump. A detailed description of a single electron pump is given by H. Pothier et al, Europhys. Lett. 17, p 249 [1992]. Referring to FIG. 5, the device comprises three tunneling junctions $T_1$, $T_2$, $T_3$ biased through non-tunneling capacitors $C_1$, $C_2$, by voltage sources $U_1$, $U_2$. If the voltages from the sources $U_1$, $U_2$ are sinusoidal and 90° out of phase, then single electrons can be transferred between the conductive tracks 3, 4, sequentially.

Referring to FIG. 4, the conductive tracks 3, 4 are formed by lithography as previously described, and globules of gold 5 are deposited and removed using a STM as previously described with reference to FIGS. 1 to 3 to achieve the configuration shown in plan view in FIG. 4, in which spaces between adjacent globules 5 define the tunneling junctions $T_1$, $T_2$, $T_3$ and the globule configurations $C_1$, $C_2$ define the corresponding non-tunneling capacitors. The voltage sources $U_1$, $U_2$ can be supplied from external sources (not shown) to conductive regions 9, 10 defined by lithography.

Figure 6:
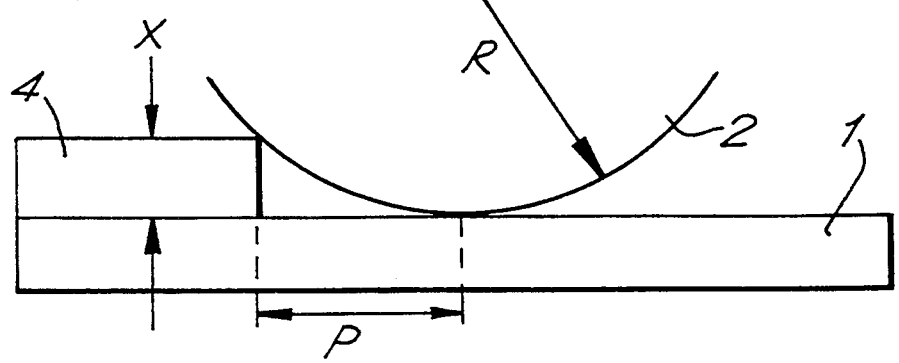
FIG. 6 illustrates a geometrical constraint associated with the device shown in FIG. 1.

The problem with a fabrication technique as described with reference to FIGS. 1 to 4 is that it is difficult to arrange with a probe such as a STM or AFM to arrange the tip thereof in close proximity to the conductive tracks 3, 4 since, on the atomic scale, the tip of the STM 2 has a large radius R and the conductive tracks have a thickness X, as shown in FIG. 6, which results in the apex of the STM tip being unable to get closer than a distance P to the conductive track. The distance of closest approach P is given by $\sqrt{(X^2+2XR)}$.

Thus, for practical purposes, the largest size of the globules 5 produced by field emission is approximately 20 nm in diameter, and in this case, it is necessary reduce P to 10 nm or smaller in order that the metal deposit will be able to make contact with the conductive track 4. Analysis has shown that the STM tip, which typically is of radius 1 $\mu$m, will not enable a sufficiently close approach even when the thickness X of the contact 4 is made of the order of 1Å thick. Thus, the tip needs to be substantially less than 1 $\mu$m in diameter, which is very difficult to achieve in practice.

It might be thought possible to increase the diameter of the deposits 5 but this has a disadvantage that it increases the capacitance for each deposit and thus lowers the operating temperature of the device, with the result that it may not operate at room temperature.

Figure 7:
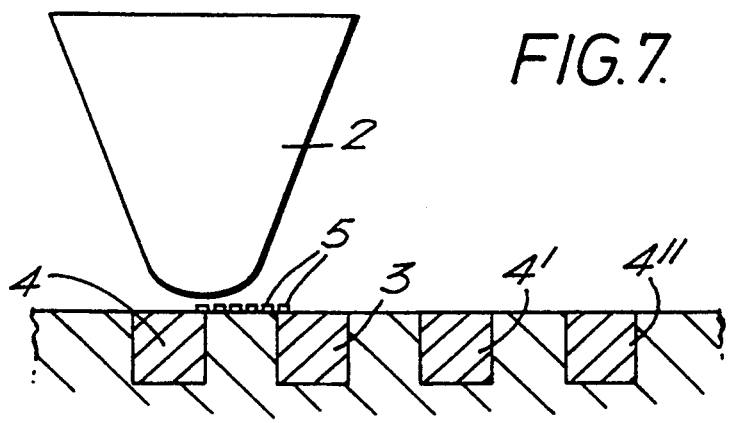
FIG. 7 illustrates in schematic cross section another structure in accordance with the invention.

A solution is provided to this problem in accordance with the invention. Referring now to FIG. 7, the substrate is so arranged that the conductive tracks 3, 4 are formed in trenches in the substrate 1 such that the upper surface of the substrate and the conductive tracks 3, 4 is substantially planar and continuous i.e. without substantial discontinuity. The globules 5, are deposited between the tracks 3, 4 in the manner previously described by means of the STM probe 2. Since the conductive tracks 3, 4 are recessed into the substrate, the tip of the probe 2 can be used to deposit the globules in direct contact with the tracks 3, 4 thereby overcoming the problem associated with the configuration shown in FIGS. 1 to 3.

The substrate 1 may also include further recessed metal deposits 4', 4" for use in the formation of further devices (not shown).

Figure 8:
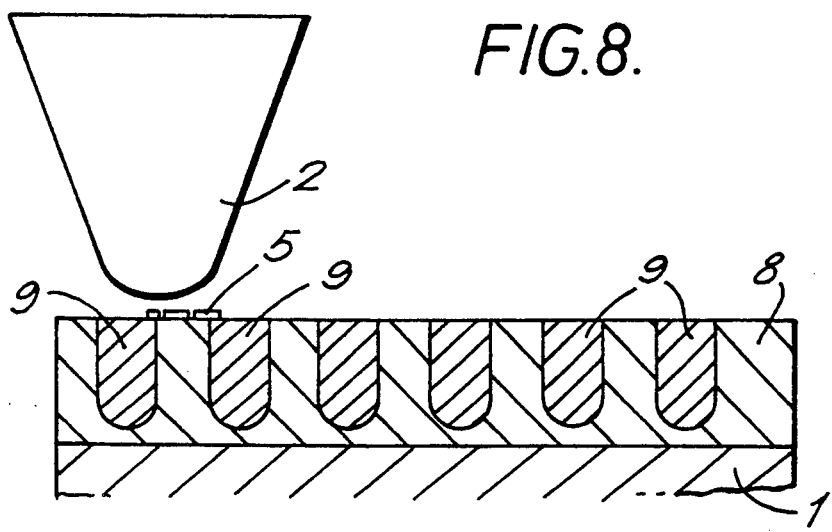
FIG. 8 similarly illustrates a further such structure.

Referring now to FIG. 8, another embodiment is shown in which the substrate 1 is provided with an overlying epitaxial layer 8 which is lightly doped so that at normal operating temperatures, for example, room temperature of say 300° K., it exhibits a relatively low conductivity. Formed in the layer 8 is a plurality of spaced, heavily doped regions 9 which, at the operating temperature are normally conductive and thus perform the function of the buried metal conductive strips 3, 4 shown in FIG. 7. The heavily doped regions 9 can be formed by focused ion beam lithography. With the contact structures shown in FIGS. 7 and 8, it is possible to form devices using a tip 2 of substantially any suitable radius.

As previously mentioned, the substrate needs to be in a conductive condition at the time of deposition of the globules 5, and thereafter needs to be converted to a substantially non-conductive state so that in use, charge carriers flow along the chain of globules 5, between the contacts 3, 4 or 9. This can be achieved in a number of different ways. A first method makes use of the so-called Mott transition.

When a semiconductor is doped, there are two density regimes in which the conductivity $\sigma$ of the substrate behaves differently, which are exhibited as the substrate is cooled. If the density of dopants is low such that the distance between the dopant impurities is larger than the spatial extent of the donor acceptor wavefunction, then on cooling, the conductivity $\sigma$ drops as free carriers recombine with the donor acceptors. This culminates in $\sigma$ dropping to virtually zero when the thermal energy is less than the ionization energy of the donor/acceptors. In this state, it is said that the carriers in the semiconductor have frozen out. If the density of the dopants is progressively increased, then at some density the wavefunctions of the carrier-dopant combination will begin to overlap and in this case even when the ionization energy is small compared with the thermal energy, conduction will still be possible by the process of impurity band conduction. In this case $\sigma$ will still be finite even at 0° K. due to the conduction paths through the impurity band. When the semiconductor undergoes a large change of conductivity on cooling, it is said to have gone through the metal-insulator transition, which was first elucidated by Mott, and hence is known as a Mott transition.

Thus, for example with the configurations shown in FIGS. 7 and 8, the substrate can be made conductive at normal room temperatures and configured to undergo a Mott transition when cooled towards absolute zero, so that the devices can be constructed at room temperature and then operated at lower temperatures at which the substrate exhibits low conductivity. Considering in more detail the embodiment of FIG. 8, the epitaxial layer 8 can be so arranged that its dopant concentration produces low conductivity and is above the Mott transition temperature, at normal room temperature. The regions 9 are doped such that remain conductive even when the substrate is cooled so as to provide a conductive path whereas, the layer 8 switches to a non-conductive condition, when cooled to allow operation of the device.

A problem with using a Mott transition is that it requires cooling the device below room temperature, which is a preferential temperature of operation for the device. Thus, in an alternative embodiment, the substrate is configured so that it is substantially insulating at normal room temperatures whereas upon heating, it assumes a relatively low resistance condition. Thus in accordance with the invention, the device may be formed on the substrate at a temperature elevated above room temperature and thereafter cooled to room temperature for operation. At such elevated temperatures, thermally energized electrons cross the band gap of the semiconductor and thereby reduce its conductivity, thus achieving a condition at which the STM can deposit the metallic globules 5 on the substrate. This may be used particularly with the arrangements shown in FIGS. 1 to 3 and can also be used with the configurations shown in FIGS. 7 and 8.

Figure 9:
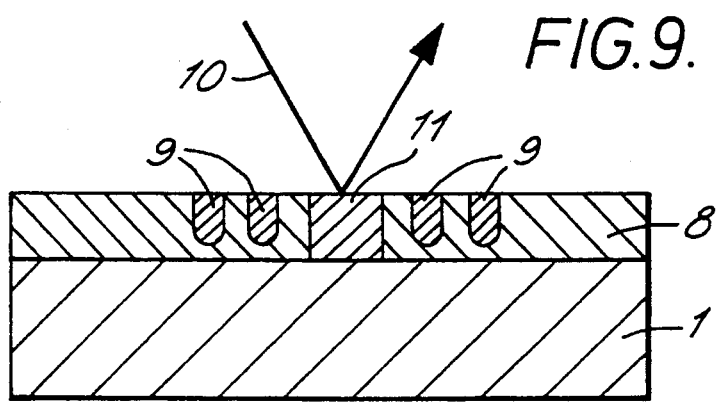
FIG. 9 shows the use of a laser to render the structure of FIG. 8 temporarily conductive during fabrication.

An alternative way of rendering an essentially non-conductive substrate into a temporary, conductive condition, is to direct a laser beam into the substrate in the region of the STM tip while the device is being fabricated. Referring to FIG. 9, this illustrates a configuration similar to FIG. 8, in which two of the conducting regions 9 are shown. The laser beam 10 is swept over the surface of the insulating layer 8 continuously and produces carriers therein, so that the layer, in the region 11 under the laser beam, is rendered conductive. The STM tip (not shown) can then be used to fabricate the device in the conductive region. Typically, a near-infrared laser could be used. Typically, the spot size is be of the order of 10μm, which covers the entire scanned area for the STM probe.

Thus, conducting devices on the nanoscale can be formed on the surface of the substrate. Operation of the device shown in FIG. 4 will now be described in more detail.

The junction capacitance of each region $T_1$-$T_3$, is between 100 and 1000 less than the tunnel capacitances proposed in the aforementioned prior art. Such prior art devices can theoretically be clocked at approximately 30 MHz while preserving sufficient accuracy to be called a current standard. Such a frequency leads to an output current of 5pA, which is too small to usefully to take advantage of its accurately quantized nature. In contrast, the device shown in FIG. 4, with junctions of capacitance 100 times less, the spurious tunnel effects are substantially reduced. As a result, the clocking frequency can be increased by a factor of 100 to around 3 GHz due to the reduction in the RC time constant, while maintaining the dropout rate to acceptably low levels. This leads to an output current of 0.5 nA, which is at a level at which the current can be used directly as a standard value, without the need for further amplification. In the prior art, it has been proposed to use a plurality of current standard devices in parallel in order to increase the current. The requirement for such complexity is overcome by the example of the present invention shown in FIG. 4.

Furthermore, it will be apparent that the structure shown in FIG. 4 can be modified in order to create a family of clocked logic devices using Coulomb blockade of single electron tunneling, so as to implement the various structures described in our aforementioned co-pending application 9206812.1.

Since the regions 6, 7, $T_1$, $T_2$, $T_3$ have very small capacitances, as previously described, the Coulomb blockade effect of single electron tunneling will occur at temperatures at or in excess of room temperature and hence the device can be operated at room temperature. As the charging energies of the devices are orders of magnitude higher than present day devices, the operational temperature can be increased.

I claim:

1. A method of forming a nano-scale electroconductive structure wherein a probe is used to produce a desired configuration of matter on a substrate, including causing the substrate to change from a relatively low to a relatively high conductivity condition, producing with the probe said desired configuration of matter on the substrate while in said relatively high conductivity condition, and thereafter causing the substrate to assume said relatively low conductivity condition, wherein said substrate assumes said relatively low conductivity condition at room temperature, and is heated to a temperature in excess of room temperature to achieve said relatively high conductivity condition during which said structure is formed with said probe.

2. A method according to claim 1 including forming said desired configuration of matter on the substrate with a STM.

3. A method according to claim 1 including producing atomic emission from the probe such as to form a desired deposit of the emitted atoms on the substrate as a conductive structure.

4. A method according to claim 1 including forming a chain of globules of material emitted from the probe, in a chain on the substrate.

5. A method according to claim 4 including spacings in said chain which define capacitive couplings and tunnel junction capacitances.

6. A method according to claim 5 wherein said capacitive couplings are configured to produce Coulomb blockade of single electron tunneling along the chain.

* * * * *

UNITED STATES PATENT AND TRADEMARK OFFICE
CERTIFICATE OF CORRECTION

PATENT NO. : 5,365,073
DATED : November 15, 1994
INVENTOR(S) : Julian D. WHITE

It is certified that error appears in the above-indentified patent and that said Letters Patent is hereby corrected as shown below:

| Column | Line | |
|---|---|---|
| 1 | 17 | After "Eigler" insert --,--; after "Science" insert --,--. |
| 1 | 31 | After "structure" insert --is--. |
| 2 | 56 | Change "one" to --the--. |
| 3 | 22 | After "on" insert --the--. |
| 3 | 24 | After "chain" insert --on--. |
| 5 | 13 | Change "C$_2$define" to --C$_2$ define--. |
| 7 | 30 | After "usefully" delete "to". |

Signed and Sealed this

Fifteenth Day of August, 1995

Attest:

BRUCE LEHMAN

Attesting Officer     Commissioner of Patents and Trademarks